(12) United States Patent
Chuang et al.

(10) Patent No.: US 10,149,081 B2
(45) Date of Patent: Dec. 4, 2018

(54) HEADPHONE AMPLIFIER CIRCUIT FOR HEADPHONE DRIVER, OPERATION METHOD THEREOF, AND USB INTERFACED HEADPHONE DEVICE USING THE SAME

(71) Applicant: REALTEK SEMICONDUCTOR CORP., Hsinchu (TW)

(72) Inventors: Tsung-Peng Chuang, Hsinchu County (TW); Shao-Hsun Lee, Taipei (TW); Cheng-Pin Chang, Taipei (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/788,083

(22) Filed: Oct. 19, 2017

(65) Prior Publication Data

US 2018/0192220 A1    Jul. 5, 2018

(30) Foreign Application Priority Data

Dec. 29, 2016   (TW) .............................. 105143946 A

(51) Int. Cl.
*H04S 1/00* (2006.01)
*H03G 3/30* (2006.01)
*H04S 7/00* (2006.01)

(52) U.S. Cl.
CPC ............ *H04S 1/005* (2013.01); *H03G 3/3005* (2013.01); *H04S 7/308* (2013.01); *H04R 2420/09* (2013.01)

(58) Field of Classification Search
USPC ........ 381/1, 10, 17, 26, 28, 74, 80, 85, 120, 381/309, 370
See application file for complete search history.

(56) References Cited

U.S. PATENT DOCUMENTS

2016/0359512 A1\*   12/2016   Fathollahi ............ H04B 1/3833

FOREIGN PATENT DOCUMENTS

| CN | 205232422 | \* | 5/2016 | ............... H04R 1/10 |
| CN | 205232422 U | | 5/2016 | |
| CN | 105898655 | \* | 8/2016 | ............... H04R 1/10 |
| CN | 105898655 A | | 8/2016 | |

\* cited by examiner

*Primary Examiner* — Yosef K Laekemariam
(74) *Attorney, Agent, or Firm* — Li & Cai Intellectual Property (USA) Office

(57) ABSTRACT

Provided herein are a headphone amplifier circuit for a headphone driver, an operation method thereof, and a universal serial bus (USB) interfaced headphone device using the same. The output stage of the headphone amplifier circuit is improved to have a differential output structure so as to effectively solve the crosstalk issue and increase the isolation between the left and the right channels such that the audio content presents a spatial perception and a distance perception more specifically.

6 Claims, 5 Drawing Sheets

HEADPHONE AMPLIFIER CIRCUIT FOR HEADPHONE DRIVER, OPERATION METHOD THEREOF, AND USB INTERFACED HEADPHONE DEVICE USING THE SAME

BACKGROUND

1. Technical Field

The present disclosure generally relates to a headphone amplifier circuit for a headphone driver and an operation method thereof and, more particularly, to a universal serial bus (USB) interfaced headphone device using the headphone amplifier circuit having a differential output as its output stage.

2. Description of Related Art

For a currently available headphone driver, when it is coupled to a headphone amplifier circuit through wires, the left channel sound may be slightly heard from the right channel and the right channel sound may be slightly heard from the left channel because the headphone amplifier circuit uses a single-ended output as its output stage.

For example, FIG. 1 is a schematic diagram of a conventional headphone amplifier circuit using a single-ended output. As shown in FIG. 1, the headphone amplifier circuit 12 is fabricated in an integrated circuit (IC) 10. The integrated circuit 10 includes at least three nodes HPO_R, HPO_L, and GND_ref, respectively, connected to three nodes R, L, and GND on the headphone driver 14 through wires. On the other hand, the headphone driver 14 further includes a right headphone 14_R and a left headphone 14_L.

When the headphone driver 14 and the integrated circuit 10 are connected and the headphone amplifier circuit 12 starts to work, the left audio signal generated by the headphone amplifier circuit 12 is transmitted to the left headphone 14_L through a wire connecting node HPO_L on the integrated circuit 10 and node L on the headphone driver 14, and the right audio signal generated by the headphone amplifier circuit 12 is transmitted to the right headphone 14_R through a wire connecting node HPO_R on the integrated circuit 10 and node R on the headphone driver 14.

However, as shown in FIG. 1, since the left headphone 14_L and the right headphone 14_R have a common reference ground, part of the right audio signal is coupled to a wire connecting node GND and node GND_ref when the integrated circuit 10 outputs the right audio signal from node HPO_R. Consequently, such coupled signal is transmitted to the left headphone 14_L to cause the right audio signal to be heard from the left headphone 14_L by the user. This degrades the listening quality.

In view of the above, there is need to effectively solve the crosstalk issue and increase the isolation between the left and the right channels.

SUMMARY

One embodiment of the present disclosure provides a headphone amplifier circuit for a headphone driver. The headphone driver is configured to output a left channel sound and/or a right channel sound, and the headphone driver includes a first left channel input node, a second left channel input node, a first right channel input node, a second right channel input node, a left headphone and a right headphone. The headphone amplifier circuit includes an audio processing circuit and at least one phase adjuster. The audio processing circuit is configured to generate a left audio signal and a right audio signal. The phase adjuster is coupled to the audio processing circuit to perform phase adjustment on the left audio signal and the right audio signal, respectively, to generate a first adjusted signal having an identical amplitude and an opposite phase to the left audio signal and a second adjusted signal having an identical amplitude and an opposite phase to the right audio signal.

One embodiment of the present disclosure further provides an operation method for a headphone amplifier circuit of a headphone driver. The headphone driver is configured to output a left channel sound and/or a right channel sound, and the headphone driver includes a first left channel input node, a second left channel input node, a first right channel input node, a second right channel input node, a left headphone and a right headphone. The operation method includes the following steps. First, a left audio signal and a right audio signal are generated by an audio processing circuit. Then, phase adjustment is performed on the left audio signal and the right audio signal, respectively, by at least one phase adjuster to generate a first adjusted signal with an identical amplitude and an opposite phase to the left audio signal and a second adjusted signal with an identical amplitude and an opposite phase to the right audio signal.

One embodiment of the present disclosure further provides a universal serial bus (USB) interfaced headphone device. The headphone device includes a USB plug, a USB-to-digital converter, a digital-to-analog converter (DAC), a headphone amplifier circuit and a headphone driver. The USB plug is configured to be coupled to a USB socket on a host computer. The USB-to-digital converter is configured to receive a digital USB signal from the host computer through the USB plug and convert the digital USB signal into a digital audio signal. The digital-to-analog converter is coupled to the USB-to-digital converter and configured to convert the digital audio signal into an analog audio signal. The headphone amplifier circuit is coupled to the digital-to-analog converter, and configured to generate a left audio signal, a right audio signal, a first adjusted signal and a second adjusted signal. The headphone driver is coupled to the headphone amplifier circuit and configured to output a left channel and/or a right channel sound. The headphone driver includes a first left channel input node, a second left channel input node, a first right channel input node, a second right channel input node, a left headphone and a right headphone. The headphone amplifier circuit includes an audio processing circuit and at least one phase adjuster. The audio processing circuit is configured to generate the left audio signal and the right audio signal according to the digital audio signal. The phase adjuster is coupled to the audio processing circuit and configured to perform phase adjustment on the left audio signal and the right audio signal, respectively, to generate the first adjusted signal having an identical amplitude and an opposite phase to the left audio signal and the second adjusted signal having an identical amplitude and an opposite phase to the right audio signal.

Preferably, the headphone amplifier circuit is disposed in an integrated circuit and the integrated circuit includes a first left channel output node, a second left channel output node, a first right channel output node and a second right channel output node so as to be connected to the first left channel input node, the second left channel input node, the first right channel input node and the second right channel input node on the headphone driver, respectively.

Preferably, when the headphone driver outputs the left channel sound, the left audio signal generated by the audio processing circuit is transmitted to the left headphone through the first left channel output node on the integrated circuit and the first left channel input node on the headphone driver and, at the same time, the first adjusted signal generated by the phase adjuster and with an identical amplitude and an opposite phase to the left audio signal is transmitted to the left headphone through the second left channel output node on the integrated circuit and the second left channel input node on the headphone driver.

Preferably, when the headphone driver outputs the right channel sound, the right audio signal generated by the audio processing circuit is transmitted to the right headphone through the first right channel output node on the integrated circuit and the first right channel input node on the headphone driver and, at the same time, the second adjusted signal generated by the phase adjuster and with an identical amplitude and an opposite phase to the right audio signal is transmitted to the right headphone through the second right channel output node on the integrated circuit and the second right channel input node on the headphone driver.

As previously stated, the present disclosure provides a headphone amplifier circuit for a headphone driver, an operation method thereof, and a USB interfaced headphone device using the same. The output stage of the headphone amplifier circuit is improved to have a differential output structure so as to effectively solve the crosstalk issue and increase the isolation between the left and the right channels such that the audio content presents a spatial perception and a distance perception more specifically. In addition, with the use of the present disclosure, the output signal is enhanced and radio interference is eliminated at the same time to overcome the problems in the conventional art.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

The detailed description set forth below in connection with the appended drawings is intended as a description of certain embodiments of the present disclosure, and is not intended to represent the only forms that may be developed or utilized. The description sets forth the various functions in connection with the illustrated embodiments, but it is to be understood, however, that the same or equivalent functions may be accomplished by different embodiments that are also intended to be encompassed within the scope of the present disclosure.

Figure 2:
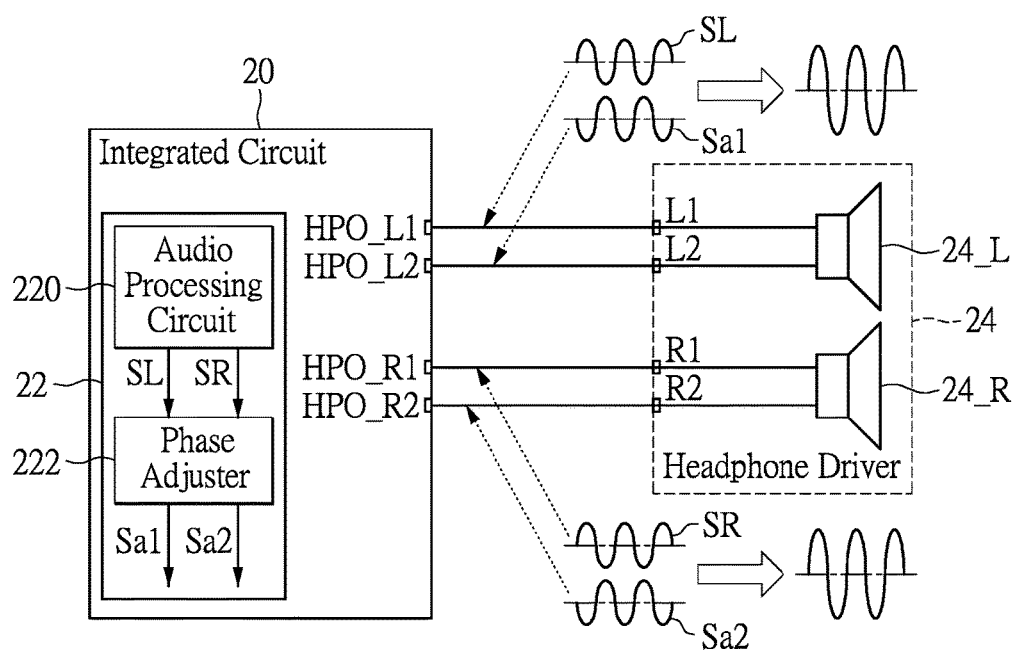
FIG. 2 is a circuit diagram of a headphone amplifier circuit for a headphone driver according to one embodiment of the present disclosure.

First, referring to FIG. 2, FIG. 2 is a circuit diagram of a headphone amplifier circuit for a headphone driver according to one embodiment of the present disclosure. The headphone amplifier circuit 22 includes an audio processing circuit 220 and at least one phase adjuster 222. These elements can be implemented by hardware circuitry, or by hardware circuitry with firmware or with software implemented by hardware circuitry, or by hardware circuitry with firmware or with software. In brief, the present disclosure is not limited to the implementation of the headphone amplifier circuit 22. In addition, the audio processing circuit 220 and the phase adjuster 222 can be integrated or installed discretely, to which the present disclosure is not limited.

Furthermore, the audio processing circuit 220 is configured to generate a left audio signal SL and a right audio signal SR, while the phase adjuster 222 is coupled to the audio processing circuit 220 to perform phase adjustment on the left audio signal SL and the right audio signal SR, respectively, to generate a first adjusted signal Sa1 having an identical amplitude and an opposite phase to the left audio signal SL and a second adjusted signal Sa2 having an identical amplitude and an opposite phase to the right audio signal SR.

However, since the headphone amplifier circuit 22 is known to the person with ordinary skill in the art, detailed descriptions of the audio processing circuit 220 and the phase adjuster 222 are not presented herein. It is worth noting that the present disclosure is not limited to the implementations of the left audio signal SL and the right audio signal SR generated by the audio processing circuit 220. The person with ordinary skill in the art may make any modifications according to actual demands or applications.

As previously stated, the headphone amplifier circuit 22 can be fabricated in an integrated circuit (IC) 20. Therefore, in the present embodiment, the integrated circuit 20 provides four nodes HPO_L1, HPO_L2, HPO_R1, and HPO_R2. Moreover, the headphone driver 24 may also provide four nodes L1, L2, R1, and R2. The four nodes HPO_L1, HPO_L2, HPO_R1, and HPO_R2 on the integrated circuit 20 are respectively connected to the four nodes L1, L2, R1, and R2 on the headphone driver 24 through wires. It should be noted that the present disclosure is not limited to the implementations of the interconnection between the headphone driver 24 and the integrated circuit 20. The person with ordinary skill in the art may make any modifications according to actual demands or applications.

Practically, the four nodes HPO_L1, HPO_L2, HPO_R1, and HPO_R2 on the integrated circuit 20 can be respectively connected to four different nodes on an audio socket (not shown) through wires. On the other hand, the headphone driver 24 may provide an audio plug (not shown) providing nodes L1, L2, R1, and R2. Therefore, when the audio plug of the headphone driver 24 is plugged into the audio socket, the headphone driver 24 and the integrated circuit 20 are connected. Similarly, since the headphone driver 24 is configured to output a left channel sound and/or a right channel sound, the headphone driver 24 provides a right headphone 24_R and a left headphone 24_L.

Therefore, when the headphone amplifier circuit 22 is turned on and the headphone driver 24 outputs the left channel sound, the left audio signal SL generated by the audio processing circuit 220 is transmitted to the left headphone 24_L through node HPO_L1 on the integrated circuit 20 and node L1 on the headphone driver 24 and, at the same time, the first adjusted signal Sa1 generated by the phase adjuster 222 and with an identical amplitude and an opposite phase to the left audio signal SL is transmitted to the left headphone 24_L through node HPO_L2 on the integrated circuit 20 and node L2 on the headphone driver 24.

On the other hand, when the headphone driver 24 outputs the right channel sound, the right audio signal SR generated by the audio processing circuit 220 is transmitted to the right headphone 24_R through node HPO_R1 on the integrated circuit 20 and node R1 on the headphone driver 24 and, at the same time, the second adjusted signal Sa2 generated by the phase adjuster 222 and with an identical amplitude and an opposite phase to the right audio signal SR is transmitted to the right headphone 24_R through node HPO_R2 on the integrated circuit 20 and node R2 on the headphone driver 24.

Figure 1:
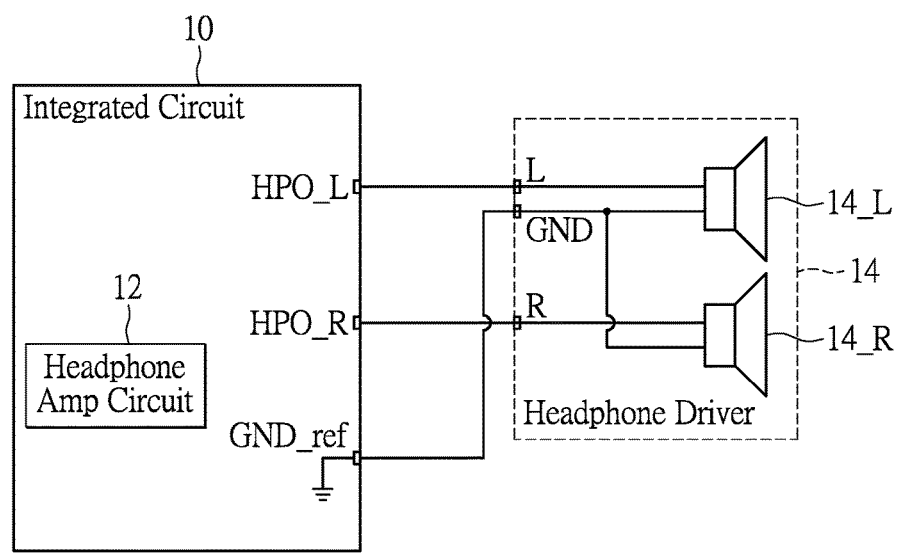
FIG. 1 is a schematic diagram of a conventional headphone amplifier circuit using a single-ended output.

Obviously, different from FIG. 1 where the left and the right channels use a signal wire and a grounding wire connecting the integrated circuit 10 and the headphone driver 14, the left and the right channels in the present embodiment use two signal wires (i.e., one connecting node HPO_L1 and node L1 and the other connecting node HPO_L2 and node L2 for the left channel; and one connecting node HPO_R1 and node R1 and the other connecting node HPO_R2 and node R2 for the right channel) for signal transmission. The signals transmitted on the two signal wires (i.e., the left audio signal SL and the first adjusted signal Sa1 for the left channel; and the right audio signal SR and the second adjusted signal Sa2 for the right channel) have identical amplitudes and opposite phases. In other words, the signals transmitted on the two signal wires function as a differential pair of signals.

Accordingly, in FIG. 2, even if the headphone driver 24 outputs only a sound from one channel (for example, the left channel or the right channel), the audio content for the left ear or the audio content for the right ear will not be coupled to the other signal wire because the left headphone 24_L and the right headphone 24_R do not share a common reference ground. According to the previous teachings, the person with ordinary skill in the art should understand that one object of the present disclosure is to improve the output stage of the headphone amplifier circuit 22 to have a differential output structure so as to effectively solve the crosstalk issue and increase the isolation between the left and the right channels such that the audio content presents a spatial perception and a distance perception more specifically.

On the other hand, with the use of the present disclosure, the person with ordinary skill in the art should also understand that the output stage of the headphone amplifier circuit 22 is improved to have a differential output structure. Therefore, the output signal of the headphone amplifier circuit 22 of the present disclosure is enhanced. More particularly, the general single-ended output structure has a limitation of the output swing. Therefore, taking a low power headphone amplifier circuit for example, the output swing of the headphone amplifier circuit 12 in FIG. 1 is about 1 Vrms, which may result in insufficient power for a high impedance headphone (for example, a 600-Ohm headphone).

In other words, insufficient output swing results in the limitation of the impedance of compatible headphones. However, as shown in FIG. 2, since the output stage of the headphone amplifier circuit 22 is improved to have a differential output structure, the output swing of the headphone amplifier circuit 22 in the present disclosure is enhanced by 100% (for example, from 1 Vrms to 2 Vrms). Consequently, the headphone amplifier circuit 22 in the present disclosure is more capable of driving a high impedance headphone and broadening the range of impedance of compatible headphones.

Figure 3:
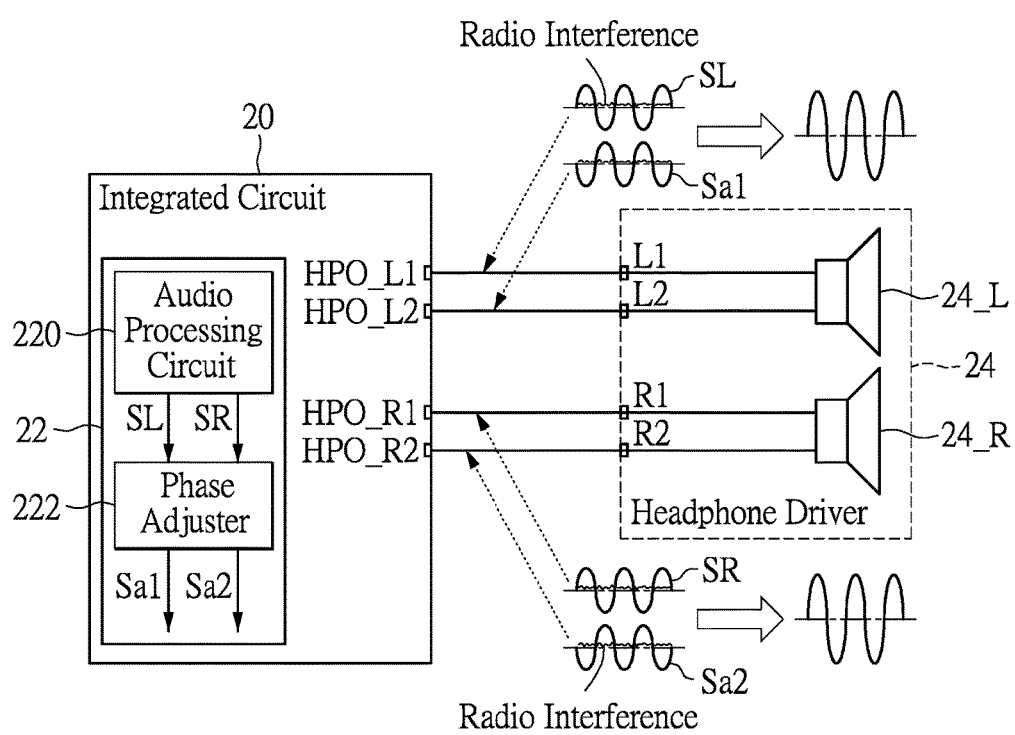
FIG. 3 is a schematic diagram showing radio interference elimination on a headphone amplifier circuit in FIG. 2.

On the other hand, every signal wire can be equivalent to an antenna, which causes radio interference due to the antenna effect. However, referring to FIG. 3, FIG. 3 is a schematic diagram showing radio interference elimination on a headphone amplifier circuit in FIG. 2. Based on the theory of differential amplifiers, the radio interference signals generally have identical amplitudes and opposite phases and are loaded onto a pair of signal wires at the same time (for example, the signal wire connecting node HPO_L1 and node L1 and the signal wire connecting node HPO_L2 and node L2). Therefore, radio interference is eliminated on the headphone amplifier circuit 22 in the present disclosure so as to improve the clarity of the audio content.

Figure 4:
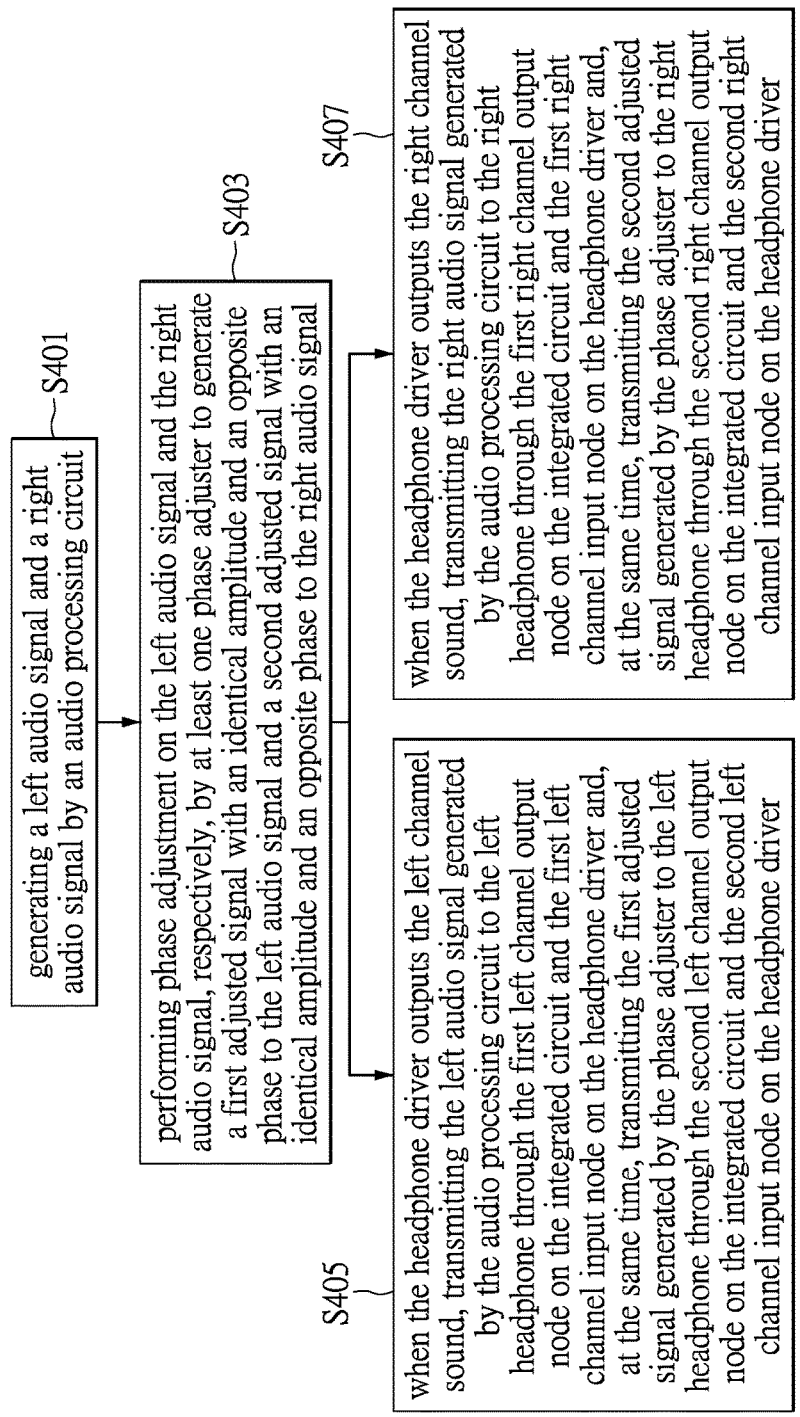
FIG. 4 is a flowchart of an operation method for a headphone amplifier circuit of a headphone driver according to one embodiment of the present disclosure.

To further describe the operation of the headphone amplifier circuit 22, the present disclosure advances to provide an implementation of an operation method of the headphone amplifier circuit 22. Referring to FIG. 4, FIG. 4 is a flowchart of an operation method for a headphone amplifier circuit of a headphone driver according to one embodiment of the present disclosure. The operation method of the present embodiment can be conducted in the headphone amplifier circuit 22 in FIG. 2. Therefore, please refer to FIG. 2 to FIG. 4 for better understanding. Moreover, detailed descriptions thereof have been presented as above, and will not be repeated herein.

First, in Step S401, a left audio signal and a right audio signal are generated by an audio processing circuit. Then, in Step S403, phase adjustment is performed on the left audio signal and the right audio signal, respectively, by at least one phase adjuster to generate a first adjusted signal with an identical amplitude and an opposite phase to the left audio signal and a second adjusted signal with an identical amplitude and an opposite phase to the right audio signal.

Then, in Step S405, when the headphone driver outputs the left channel sound, the left audio signal generated by the audio processing circuit is transmitted to the left headphone through the first left channel output node (for example, node HPO_L1 in FIG. 2) on the integrated circuit and the first left channel input node (for example, node L1 in FIG. 2) on the headphone driver and, at the same time, the first adjusted signal generated by the phase adjuster and with an identical amplitude and an opposite phase to the left audio signal is transmitted to the left headphone through the second left channel output node (for example, node HPO_L2 in FIG. 2) on the integrated circuit and the second left channel input node (for example, node L2 in FIG. 2) on the headphone driver.

Moreover, in Step S407, when the headphone driver outputs the right channel sound, the right audio signal generated by the audio processing circuit is transmitted to the right headphone through the first right channel output node (for example, node HPO_R1 in FIG. 2) on the integrated circuit and the first right channel input node (for example, node R1 in FIG. 2) on the headphone driver and, at the same time, the second adjusted signal generated by the phase adjuster and with an identical amplitude and an opposite phase to the right audio signal is transmitted to the right headphone through the second right channel output node (for example, node HPO_R2 in FIG. 2) on the integrated circuit and the second right channel input node (for example, node R2 in FIG. 2) on the headphone driver.

It should be understood that Step S405 and Step S407 can be conducted in parallel without any conflict. Moreover, it is worth noting that the present disclosure is not limited to the implementations of the interconnection between the four nodes on the headphone driver and the four nodes on the integrated circuit. The person with ordinary skill in the art may make any modifications according to actual demands or applications.

Figure 5:
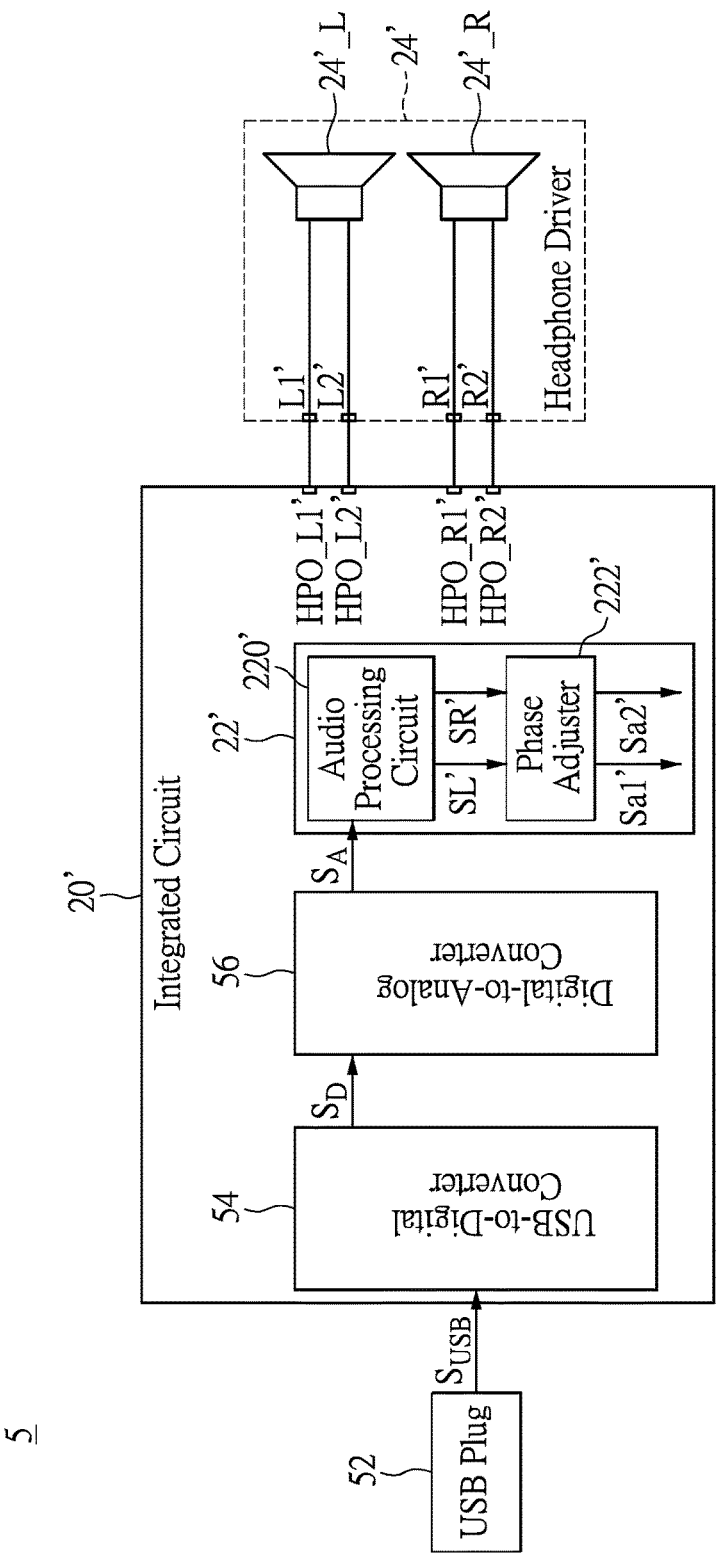
FIG. 5 is a schematic diagram of a USB interfaced headphone device according to one embodiment of the present disclosure.

On the other hand, in recent years, the USB interfaced headphone device has attracted lots of attention. Especially, the novel Type-C standard provides many innovative functions. Therefore, one object of the present disclosure is to provide a USB interfaced headphone device using the headphone amplifier circuit in previous embodiments. Referring to FIG. 5, FIG. 5 is a schematic diagram of a USB interfaced headphone device according to one embodiment of the present disclosure. Some elements in FIG. 5 that are identical or similar to those in FIG. 2 are labeled with identical or similar symbols, and descriptions thereof are thus not presented herein.

As shown in FIG. 5, the headphone device 5 includes a USB plug 52, a USB-to-digital converter 54, a digital-to-analog converter 56, a headphone amplifier circuit 22 and a headphone driver 24. The USB-to-digital converter 54, the digital-to-analog converter 56 and the headphone amplifier circuit 22 can be integrated or installed discretely, to which the present disclosure is not limited. The USB plug 52 is configured to be coupled to a USB socket on a host computer (not shown). The USB-to-digital converter 54 is configured to receive a digital USB signal $S_{USB}$ from the host computer through the USB plug 52 and convert the digital USB signal $S_{USB}$ into a digital audio signal $S_D$. Then, the digital-to-analog converter 56 is coupled to the USB-to-digital converter 54, and configured to convert the digital audio signal $S_D$ into an analog audio signal $S_A$.

Moreover, the headphone amplifier circuit 22' is coupled to the digital-to-analog converter 54, and configured to generate a left audio signal SL', a right audio signal SR', a first adjusted signal Sa1' and a second adjusted signal Sa2'. The headphone driver 24' is coupled to the headphone amplifier circuit 22', and configured to output a left channel and/or a right channel sound. The headphone amplifier circuit 22' in FIG. 5 is similar to the headphone amplifier circuit 22 in FIG. 2, and the headphone driver 24' in FIG. 5 is similar to the headphone driver 24 in FIG. 2. Therefore, the headphone amplifier circuit 22' in FIG. 5 similarly includes an audio processing circuit 220' and at least one phase adjuster 222'. The headphone driver 24' in FIG. 5 similarly includes a right headphone 24'_R and a left headphone 24'_L.

However, since the USB-to-digital converter 54 and the digital-to-analog converter 56 are known to the person with ordinary skill in the art, detailed descriptions thereof are not presented herein. It should be noted that, in the present embodiment, "USB interfaced" may indicate that the USB plug 52 conforms to the Type-C standard, to which, however, the present disclosure is not limited. In other words, the present disclosure is not limited to the implementation of the USB plug 52. In addition, in the present embodiment, the USB-to-digital converter 54, the digital-to-analog converter 56 and the headphone amplifier circuit 22 can be integrated. Therefore, the USB-to-digital converter 54, the digital-to-analog converter 56 and the headphone amplifier circuit 22' can be fabricated in the integrated circuit 20', to which, however, the present disclosure is not limited.

Therefore, obviously, the integrated circuit 20' in FIG. 5 provides four nodes HPO_L1', HPO_L2', HPO_R1', and HPO_R2'. Moreover, the headphone driver 24' in FIG. 5 also provides four nodes L1', L2', R1', and R2'. The four nodes HPO_L1 HPO_L2', HPO_R1', and HPO_R2' on the integrated circuit 20' are respectively connected to the four nodes L1', L2', R1', and R2' on the headphone driver 24' through wires. It should be noted that the present disclosure is not limited to the implementations of the interconnection between the four nodes HPO_L1 HPO_L2', HPO_R1', and HPO_R2' on the integrated circuit 20' and the four nodes L1', L2', R1', and R2' on the headphone driver 24'. The person with ordinary skill in the art may make any modifications according to actual demands or applications.

Therefore, according to the previous teachings, the person with ordinary skill in the art should understand that the audio processing circuit 220' in FIG. 5 is configured to generate the left audio signal SL' and the right audio signal SR' according to the digital audio signal $S_A$. Moreover, the phase adjuster 222' in FIG. 5 is configured to perform phase adjustment on the left audio signal SL' and the right audio signal SR', respectively, to generate a first adjusted signal Sa1' having an identical amplitude and an opposite phase to the left audio signal SL' and a second adjusted signal Sa2' having an identical amplitude and an opposite phase to the right audio signal SR'.

It is worth noting that the analog audio signal $S_A$ generated by the digital-to-analog converter 56 is, for example, a multi-channel analog audio signal $S_A$. In other words, the analog audio signal $S_A$ includes an analog audio signal on the left channel and an analog audio signal on the right channel. Therefore, the audio processing circuit 220' is configured to perform adjustment (for example, gain adjustment) on the analog audio signal on the left channel and/or the right channel in advance to generate a left audio signal SL' and a right audio signal SR'. In brief, the present disclosure is not limited to the implementations of the left audio signal SL' and the right audio signal SR' generated by the audio processing circuit 220' according to the digital audio signal $S_A$. The person with ordinary skill in the art may make any modifications according to actual demands or applications.

Therefore, when the headphone driver 24' outputs the left channel sound, the left audio signal SL' generated by the audio processing circuit 220' is transmitted to the left headphone 24'_L through node HPO_L1' on the integrated circuit 20' and node L1' on the headphone driver 24' and, at the same time, the first adjusted signal Sa1' generated by the phase adjuster 222' and with an identical amplitude and an opposite phase to the left audio signal SL' is transmitted to the left headphone 24'_L through node HPO_L2' on the integrated circuit 20' and node L2' on the headphone driver 24'.

Moreover, when the headphone driver 24' outputs the right channel sound, the right audio signal SR' generated by the audio processing circuit 220' is transmitted to the right headphone 24'_R through node HPO_R1' on the integrated circuit 20' and node R1' on the headphone driver 24' and, at the same time, the second adjusted signal Sa2' generated by the phase adjuster 222' and with an identical amplitude and an opposite phase to the right audio signal SR' is transmitted to the right headphone 24'_R through node HPO_R2' on the integrated circuit 20' and node R2' on the headphone driver 24'.

However, the digital-to-analog converter 56 and the headphone amplifier circuit 22 can be integrated. Therefore, according to the previous teachings, the person with ordinary skill in the art should understand that, in other embodiments, the phase adjuster 222' in FIG. 5 can also be implemented directly in the digital-to-analog converter 56. Accordingly, the analog audio signal $S_A$ generated by the digital-to-analog converter 56 may include two analog audio signals for the left channel and the right channel, and another two analog audio signals with an identical amplitude and an opposite phase to the two analog audio signals. Similarly, the audio processing circuit 220' is configured to perform gain adjustment on these four analog audio signals in advance to generate a left audio signal SL', a right audio signal SR', a first adjusted signal Sa1' and a second adjusted signal Sa2'. In brief, the implementation of the headphone device 5 is only exemplary and not intended to limit the scope of the present disclosure. The person with ordinary skill in the art may make any modifications according to actual demands or applications.

As previously stated, the present disclosure provides a headphone amplifier circuit for a headphone driver, an operation method thereof, and a USB interfaced headphone device using the same. The output stage of the headphone amplifier circuit is improved to be a differential output structure so as to effectively solve the crosstalk issue and increase the isolation between the left and the right channels such that the audio content presents a spatial perception and a distance perception more specifically. In addition, with the use of the present disclosure, the output signal is enhanced and radio interference is eliminated at the same time to overcome the problems in the conventional art.

The above-mentioned descriptions represent merely the exemplary embodiment of the present disclosure, without any intention to limit the scope of the present disclosure thereto. Various equivalent changes, alterations or modifications based on the claims of the present disclosure are all consequently viewed as being embraced by the scope of the present disclosure.

What is claimed is:

1. A headphone amplifier circuit for a headphone driver, wherein said headphone driver is configured to output a left channel sound and/or a right channel sound, and said headphone driver comprises a first left channel input node, a second left channel input node, a first right channel input node, a second right channel input node, a left headphone and a right headphone, said headphone amplifier circuit comprising:

an audio processing circuit configured to generate a left audio signal and a right audio signal; and at least one phase adjuster coupled to said audio processing circuit to perform phase adjustment on said left audio signal and said right audio signal to generate a first adjusted signal and a second adjusted signal, respectively, wherein said first adjusted signal and said left audio signal have an identical amplitude and opposite phases, and said second adjusted signal and said right audio signal have an identical amplitude and opposite phases, wherein said headphone amplifier circuit is disposed in an integrated circuit, and said integrated circuit comprises a first left channel output node, a second left channel output node, a first right channel output node and a second right channel output node so as to be connected to said first left channel input node, said second left channel input node, said first right channel input node and said second right channel input node on said headphone driver, respectively, and wherein, when said headphone driver outputs said left channel sound, said left audio signal is transmitted to said left headphone through said first left channel output node and said first left channel input node and, at the same time, said first adjusted signal is transmitted to said left headphone through said second left channel output node and said second left channel input node.

2. The headphone amplifier circuit of claim 1, wherein, when said headphone driver outputs said right channel sound, said right audio signal is transmitted to said right headphone through said first right channel output node and said first right channel input node and, at the same time, said second adjusted signal is transmitted to said right headphone through said second right channel output node and said second right channel input node.

3. An operation method for a headphone amplifier circuit of a headphone driver, wherein said headphone driver is configured to output a left channel and/or a right channel sound, and said headphone driver comprises a first left channel input node, a second left channel input node, a first right channel input node, a second right channel input node, a left headphone and a right headphone, said operation method comprising:

generating a left audio signal and a right audio signal by an audio processing circuit;

performing phase adjustment on said left audio signal and said right audio signal by at least one phase adjuster to generate a first adjusted signal and a second adjusted signal, respectively, wherein said first adjusted signal and said left audio signal have an identical amplitude and opposite phases, and said second adjusted signal and said right audio signal have an identical amplitude and opposite phases, and wherein said headphone amplifier circuit is disposed in an integrated circuit, and said integrated circuit comprises a first left channel output node, a second left channel output node, a first right channel output node and a second right channel output node so as to be connected to said first left channel input node, said second left channel input node, said first right channel input node and said second right channel input node on said headphone driver, respectively; and when said headphone driver outputs said left channel sound, transmitting said left audio signal to said left headphone through said first left channel output node and said first left channel input node and, at the same time, transmitting said first adjusted signal to said left headphone through said second left channel output node and said second left channel input node.

4. The operation method of claim 3, further comprising:

when said headphone driver outputs said right channel sound, transmitting said right audio signal to said right headphone through said first right channel output node and said first right channel input node and, at the same time, transmitting said second adjusted signal to said right headphone through said second right channel output node and said second right channel input node.

5. A universal serial bus (USB) interfaced headphone device, comprising:

a USB plug configured to be coupled to a USB socket on a host computer;

a USB-to-digital converter configured to receive a digital USB signal from said host computer through said USB plug and convert said digital USB signal into a digital audio signal;

a digital-to-analog converter coupled to said USB-to-digital converter and configured to convert said digital audio signal into an analog audio signal;

a headphone amplifier circuit coupled to said digital-to-analog converter and configured to generate a left audio signal, a right audio signal, a first adjusted signal and a second adjusted signal; and a headphone driver coupled to said headphone amplifier circuit and configured to output a left channel and/or a right channel sound, said headphone driver comprising a first left channel input node, a second left channel input node, a first right channel input node, a second right channel input node, a left headphone and a right headphone, wherein said headphone amplifier circuit comprising:

an audio processing circuit configured to generate said left audio signal and said right audio signal according to said digital audio signal; and at least one phase adjuster coupled to said audio processing circuit and configured to perform phase adjustment on said left audio signal and said right audio signal to generate said first adjusted signal and said second adjusted signal, respectively, wherein said first adjusted signal and said left audio signal have an identical amplitude and opposite phases, and said second adjusted signal and said right audio signal have an identical amplitude and opposite phases, wherein said headphone amplifier circuit is disposed in an integrated circuit, and said integrated circuit comprises a first left channel output node, a second left channel output node, a first right channel output node and a second right channel output node so as to be connected to said first left channel input node, said second left channel input node, said first right channel input node and said second right channel input node on said headphone driver, respectively, and wherein, when said headphone driver outputs said left channel sound, said left audio signal is transmitted to said left headphone through said first left channel output node and said first left channel input node and, at the same time, said first adjusted signal is transmitted to said left headphone through said second left channel output node and said second left channel input node.

6. The headphone device of claim 5, wherein, when said headphone driver outputs said right channel sound, said right audio signal is transmitted to said right headphone through said first right channel output node and said first right channel input node and, at the same time, said second adjusted signal is transmitted to said right headphone through said second right channel output node and said second right channel input node.

* * * * *